United States Patent
Bergenek et al.

(10) Patent No.: US 10,495,262 B2
(45) Date of Patent: Dec. 3, 2019

(54) LIGHTING MEANS COMPRISING LEDS

(71) Applicant: LEDVANCE GmbH, Garching (DE)

(72) Inventors: Krister Bergenek, Regensburg (DE); Florian Bosl, Regensburg (DE); Andreas Dobner, Wenzenbach (DE); Tobias Schmidt, Garching bei Munchen (DE); Andreas Kloss, Neubiberg (DE); Frank Vollkommer, Gauting (DE)

(73) Assignee: LEDVANCE GMBH, Garching bei München (DE)

( * ) Notice: Subject to any disclaimer, the term of this patent is extended or adjusted under 35 U.S.C. 154(b) by 0 days.

(21) Appl. No.: 15/566,563

(22) PCT Filed: Feb. 17, 2016

(86) PCT No.: PCT/EP2016/053318
§ 371 (c)(1),
(2) Date: Oct. 13, 2017

(87) PCT Pub. No.: WO2016/165854
PCT Pub. Date: Oct. 20, 2016

(65) Prior Publication Data
US 2018/0106432 A1    Apr. 19, 2018

(30) Foreign Application Priority Data

Apr. 15, 2015 (DE) .................. 10 2015 206 797

(51) Int. Cl.
*F21K 9/232* (2016.01)
*F21V 7/05* (2006.01)
(Continued)

(52) U.S. Cl.
CPC .............. *F21K 9/232* (2016.08); *F21K 9/235* (2016.08); *F21K 9/237* (2016.08); *F21K 9/238* (2016.08);
(Continued)

(58) Field of Classification Search
CPC .......... F21K 9/232; F21K 9/235; F21K 9/237; F21K 9/238; F21K 9/90; F21V 17/06;
(Continued)

(56) References Cited

U.S. PATENT DOCUMENTS 8,314,566 B2 * 11/2012 Steele .................... F21V 23/02
315/185 R
8,858,027 B2 * 10/2014 Takeuchi .............. F21V 23/001
362/249.02

(Continued)

FOREIGN PATENT DOCUMENTS

| WO | 2014087357 A1 | 6/2014 |
| WO | 2014167480 A1 | 10/2014 |
| WO | 2016165855 A1 | 10/2016 |

*Primary Examiner* — Peggy A Neils
(74) *Attorney, Agent, or Firm* — Hayes Soloway PC

(57) ABSTRACT

The present invention relates to a lighting means comprising at least two LEDs mounted on opposite sides of a flat printed circuit board, said printed circuit board being combined with a reflector which is free of LEDs, a part of the light emitted by each LED being reflected by the reflector to homogenize the light distribution generated by the lighting means, and specifically in each case with a directional component parallel to a surface direction of the flat printed circuit board.

21 Claims, 7 Drawing Sheets

(51) Int. Cl.

| | | |
|---|---|---|
| *F21V 17/06* | (2006.01) | |
| *F21K 9/238* | (2016.01) | |
| *F21K 9/235* | (2016.01) | |
| *F21K 9/237* | (2016.01) | |
| *F21V 3/06* | (2018.01) | |
| *F21K 9/90* | (2016.01) | |
| *F21V 3/04* | (2018.01) | |
| *F21V 7/00* | (2006.01) | |
| *F21V 19/00* | (2006.01) | |
| *F21V 31/00* | (2006.01) | |
| *F21V 29/85* | (2015.01) | |
| *F21Y 107/90* | (2016.01) | |
| *F21Y 115/10* | (2016.01) | |
| *H05K 1/18* | (2006.01) | |

(52) U.S. Cl.
CPC ............... *F21K 9/90* (2013.01); *F21V 3/049* (2013.01); *F21V 3/061* (2018.02); *F21V 7/00* (2013.01); *F21V 7/05* (2013.01); *F21V 17/06* (2013.01); *F21V 19/0025* (2013.01); *F21V 31/005* (2013.01); *F21V 19/001* (2013.01); *F21V 29/85* (2015.01); *F21Y 2107/90* (2016.08); *F21Y 2115/10* (2016.08); *H05K 1/181* (2013.01); *H05K 2201/09027* (2013.01); *H05K 2201/10106* (2013.01); *H05K 2201/10121* (2013.01)

(58) Field of Classification Search
CPC .... F21V 19/001; F21V 19/0025; F21V 3/049; F21V 7/00; F21V 7/0025; F21V 7/05; F21Y 2107/90; F21Y 2115/10; H05K 2201/09027; H05K 2201/10106
See application file for complete search history.

(56) References Cited

U.S. PATENT DOCUMENTS

| | | | |
|---|---|---|---|
| 9,117,991 B1* | 8/2015 | Olson | F21S 43/15 |
| 10,006,608 B2* | 6/2018 | Bukkems | H05K 1/0209 |
| 10,129,960 B2* | 11/2018 | Earl | H05K 3/366 |
| 2007/0002572 A1 | 1/2007 | Ewig et al. | |
| 2012/0032577 A1 | 2/2012 | Huang | |
| 2012/0134133 A1 | 5/2012 | Kang | |
| 2013/0294092 A1* | 11/2013 | Hussell | F21V 29/004 362/363 |
| 2014/0375202 A1* | 12/2014 | Yang | F21V 29/004 313/36 |
| 2015/0252991 A1* | 9/2015 | Li | F21V 23/004 362/646 |
| 2015/0292686 A1* | 10/2015 | Negley | F21V 3/0625 315/34 |
| 2018/0080613 A1 | 3/2018 | Bergenek et al. | |

\* cited by examiner

LIGHTING MEANS COMPRISING LEDS

CROSS-REFERENCE TO RELATED APPLICATION AND PRIORITY

This patent application is a U.S. National Stage of International Patent Application No. PCT/EP2016/053318 filed on Feb. 17, 2016, which claims priority from German Patent Application No. 102015206797.1 filed on Apr. 15, 2015. Each of these patent applications is herein incorporated by reference in its entirety.

TECHNICAL FIELD

The present invention relates to a lighting means comprising LEDs arranged on a circuit board, wherein the circuit board having the LEDs is arranged in an outer bulb.

BACKGROUND OF THE INVENTION

A conventional lighting means such as, for example, a filament bulb emits light with approximately omnidirectional light distribution, thus, in simple terms, the same amount of light is emitted in all directions (except for shading by the base of the filament bulb, for example). An LED, on the other hand, emits light directionally, namely generally with Lambertian light distribution. The light intensity, or radiant intensity, is thus maximum, for example, along a surface normal to a radiating surface of the LED and decreases as the angle relative to the surface normal increases.

In order to generate homogeneous light distribution despite this directional light emission for each LED, there are known from the prior art, for example, lighting means in which a plurality of LEDs are mounted on a three-dimensional carrier, for example on five side surfaces of a cuboid. The side surfaces, and thus the main beam directions of each of the LEDs arranged thereon, point in different directions, so that approximately omnidirectional light distribution can be generated overall. However, the mere production, let alone the three-dimensional equipping, of such a three-dimensional carrier can be complex and thus cost-intensive.

SUMMARY OF THE INVENTION

The technical problem underlying the present invention is to provide a lighting means that is advantageous over the prior art.

This object is achieved according to the invention with a lighting means having a first and a second LED for emitting light, a flat circuit board having a conductive track structure, on which circuit board the LEDs are mounted and thereby electrically conductively connected to the conductive track structure, a reflector assembled with the circuit board, which reflector is free of LEDs, an outer bulb which is transmissive for the light emitted by the LEDs and in which the circuit board having the LEDs and the reflector are arranged, and a base with which the LEDs are electrically operably connected via the conductive track structure, wherein the first and the second LED are mounted on mutually opposite sides of the circuit board and, for each LED, at least 20% of the emitted light is incident on the reflector and is reflected thereby in order to homogenize the light distribution generated by the lighting means, for which purpose the particular reflected light has a main propagation direction with a directional component parallel to a surface direction of the flat circuit board.

Preferred embodiments will be found in the dependent claims and in the disclosure as a whole, a specific distinction not always being made in the presentation between device aspects and method or use aspects; in any case, the disclosure is implicitly to be read in respect of all claim categories.

In simple terms, a basic idea of the invention is to provide the LED light to two mutually opposite main directions directly by means of the circuit board equipped with LEDs on both sides, and to provide the LED light to directions that primarily are scarcely provided or are not provided at all, which are parallel to the surface directions of the circuit board, indirectly via the reflector. Accordingly, not every main direction that is required in respect of approximate omnidirectionality has its own associated LED, but the light emitted by the LEDs is partially redistributed by the reflector. For example, in comparison with the cuboid mentioned at the beginning, it is thus not necessary to equip five side surfaces with LEDs but only two, namely the mutually opposite side surfaces of the flat circuit board. This in itself is already a simpler component, and in addition it can also be simpler, for example, to equip two sides with LEDs than to equip a three-dimensional carrier.

The "flat" circuit board has a smaller extent (thickness) in a thickness direction than in the surface directions perpendicular thereto. In each of the surface directions, which also include the length and width of the circuit board (see below), the extent of the circuit board should be, for example, at least 5, 10, 15 or 20 times the thickness, a thickness averaged over the circuit board being considered. The "mutually opposite sides" of the circuit board are mutually opposite in relation to the thickness direction and are also referred to as "side surfaces" of the circuit board (which are connected together via one or more edge surfaces of the circuit board extending in the thickness direction). The LEDs are mounted on the side surfaces extending in the surface directions (no LEDs are provided on the edge surfaces, thus they are free of LEDs).

Although the LEDs could generally also be mounted on the circuit board with their particular LED main propagation direction tilted slightly relative to the thickness direction, preference is given to LED main propagation directions parallel to the thickness direction, which are thus then mutually opposite for the first and the second LED. The "LED main propagation direction" for each LED is considered to be the direction that is obtained as the average of all the direction vectors along which the LED emits light, each direction vector being weighted in this averaging with the light intensity associated therewith (each direction in which a light source radiates can be described as a vector, with which a light intensity can be associated).

With the circuit board alone, directions around the thickness direction would be well provided with light, but the surface directions would be underprovided or not provided at all. Therefore, for each LED, at least 20%, with increasing preference in this order at least 25%, 30%, 35% or 40%, of the total light emitted by the particular LED should be incident on the reflector and be reflected thereby with a directional component parallel to a surface direction. The "main propagation direction" of the reflected light, which has (not necessarily only) a directional component parallel to a surface direction, is formed as an average in the manner described above for the LED main propagation direction (there being used as the basis all the directions in which the light coming from a respective LED is reflected). By means of the reflector, light is provided to directions which originally were underprovided, thus the light distribution generated by the lighting means is homogenized.

The reflector for its part is free of LEDs, thus is itself not equipped with LEDs. In this respect, the reflector is a "passive" component. By providing the reflector and the circuit board as components which are originally separate and are then assembled in the lighting means, each component can advantageously be optimized. Thus, the circuit board, for example, has the conductive track structure for wiring the LEDs, while the reflector will preferably be free of such a structure. The reflector can be produced overall from a simpler material, or material composite, compared to the circuit board, which can help to optimize costs. The circuit board is preferably the only component of the lighting means that is equipped with LEDs, which makes the lighting means comparatively simple overall.

On the other hand, the reflector (because of reduced costs per unit area of the material) can then be designed or formed, for example, with a larger surface area compared to the circuit board, in particular compared to the portion of the circuit board arranged inside the outer bulb. The reflector can be optimized in respect of the optical properties (reflectance/surface area) and the circuit board can be optimized, for example, in respect of thermal requirements (heat dissipation from the LEDs). The circuit board and the reflector are "assembled", that is to say connected together, for example, at most by a friction-based, interlocking and/or material-based connection, preferably the two components are slotted and fitted into one another in the slot direction (see below).

The LEDs "mounted" on the circuit board are preferably soldered, at least some of the soldered connections at the same time establishing the electrical contact between the conductive track structure and the LED and serving to mechanically fix the LED (however, soldered connections that serve only for mechanical fixing/thermal connection can additionally be provided). Preferred LEDs are so-called SMD (surface mounted device) components, which are soldered in a reflow process. The lighting means can be electrically connected (from outside in use) via the base.

The LEDs are "electrically operably" connected to the base, that is to say to the connecting points thereof that serve for contacting from outside, preferably with the interposition of a driver electronics (between the connecting points of the base and the LEDs). The lighting means is preferably configured for operation at mains voltage (at least 100 volts), thus mains voltage can be applied to the base connecting points and is preferably adapted for operation of the LEDs by means of a driver electronics of the lighting means.

The lighting means is preferably designed as a filament bulb replacement; the base is preferably an Edison base, particularly preferably with the thread identifier E27. The "transmissive" outer bulb can be translucent and/or transparent. In general, the outer bulb can thus also be clear/transparent, but it is preferably frosted, thus, for example (when the lighting means is not emitting light), the circuit board is visible through the outer bulb from outside at most as an outline, preferably not at all. The frosting can be achieved, for example, by scattering centers, in particular scattering particles, embedded in the material of the outer bulb, and/or by scattering centers arranged on the surface of the outer bulb, for example a surface roughening and/or surface coating. Preference is given to a coating on the inside, that is to say a coating on the inner wall surface facing the LEDs, which can provide protection against scratches, for example, in use.

The circuit board having the LEDs is so arranged in the outer bulb that the majority of the light emitted by the LEDs passes through the outer bulb, that is to say passes from inside to outside and is usable in an application. "Majority" in this respect can mean, for example, at least 70%, preferably at least 80%, further preferably at least 90%; a possible upper limit may be, for example, not more than 99.9%. The light emitted by the LEDs can be incident on the inner wall of the outer bulb and pass through it to the outside partly directly and partly after prior reflection. The circuit board and the reflector are arranged "in" the outer bulb, that is to say in a preferably sealed inner volume delimited thereby. The outer bulb thus forms a preferably sealed (not open) vessel in which the circuit board and the reflector are arranged; the circuit board and the reflector are thus preferably enclosed by outer bulb material in all directions. All the cutting planes perpendicular to an outer bulb longitudinal axis (see below) which cut the circuit board preferably also cut the outer bulb.

In a preferred embodiment, the reflector is a one-piece component which thus cannot be dismantled into individual parts without being damaged (without damaging part of the component). In other words, the different reflector regions at which the light of the various LEDs is reflected are joined together via the reflector itself. Thus, although the reflector could generally also be composed, for example, of a plurality of individual components which are seated on the circuit board separately, it is preferably a cohesive component which is assembled as a whole with the circuit board. This can help to simplify, or reduce, for example, the necessary working steps in mass production.

In general, the reflector is preferably a component which is substantially planar, for example to the extent of at least 50%, 60%, 70%, 80% or 90% of its surface area (with increasing preference in the order given), a corresponding percentage of the mutually opposite side surfaces of which thus each lie in a plane, which planes are parallel to one another (within the scope of conventional manufacturing variations and on the relevant dimensional scales in the present case). Part regions of the reflector may be folded out of the planes in order to optimize the light distribution (see below in detail). The reflector, like the circuit board, is "flat" (larger extent in the surface directions than in the thickness direction), and the definitions mentioned above for the circuit board are also to be disclosed for the reflector; likewise analogously to the circuit board, "side surfaces" refers to the surfaces of the reflector that are mutually opposite in relation to the thickness direction.

The reflector can be composed, for example, of a core which is likewise flat in the above-mentioned sense and which is coated, preferably on both sides (on the two mutually opposite side surfaces in relation to the thickness direction), with a reflective layer, which then forms the reflecting surface. The reflective layer is preferably produced from a plastics material with reflective particles, for example white pigments, embedded therein. The core is preferably a metal core, which can have advantages from the thermal point of view.

In other preferred embodiments, the reflector is a monolithic part which, apart from, for example, particles or inclusions randomly distributed therein, is thus free in its interior of material boundaries between different materials or materials of different manufacturing origins. Thus, the reflector is then not a multilayer system as described above, but is a single-layer system, the mutually opposite (in relation to the thickness direction) side surfaces of this layer forming the reflective surfaces. This single-layer reflector can be provided, for example, in the form of a metal plate, for example with polished side surfaces. However, a single-layer reflector of a plastics material, in which, for example, reflective particles and/or gas bubbles are embedded (arranged therein in a randomly distributed manner), is also possible.

In general, the reflector, that is to say at least the side surfaces thereof on which the light of the LEDs is incident, should have a reflectivity, averaged over the visible spectral range (380 nm to 780 nm), for example, of at least, with increasing preference in this order, 80%, 85%, 90% or 95%; a possible upper limit may be, for example, 99.9%. Where reference is made to the "at least 20% of the light for each LED" that is incident on the reflector and is reflected thereby, in each case slightly more light may thus be incident thereon, of which a smaller portion is not reflected. Diffuse reflection is generally preferred, the reflective surface of the reflector is preferably white. The circuit board, apart from the regions equipped with LEDs, can, for example, also preferably be provided with a reflective surface, for example with a coating mentioned above in the context of the reflector having a core, which surface is preferably diffusely reflective.

In a preferred embodiment, the reflector and the circuit board, each as one-piece parts, are fitted into one another at a right angle to one another. For that purpose, both in the circuit board and in the reflector, a substantially straight slot which passes through the circuit board/reflector completely in the thickness direction preferably extends from one edge surface of the circuit board/reflector to a point on the circuit board/reflector. The slots each have a straight extent (in the slot direction, perpendicular to the respective thickness direction) at least insofar as the reflector in an end position then extends in the slot in the circuit board, and vice versa; preferably, the slot in the reflector is also straight overall, thus the flanks delimiting it are parallel to one another.

The circuit board and the reflector are then fitted into one another in the slot direction. The circuit board is then arranged in the slot in the reflector, and vice versa. Preference is given to an arrangement such that the slot direction in each case extends parallel to an outer bulb longitudinal axis referred to below, the slots particularly preferably coincide therewith.

In a preferred embodiment, one of the flanks which delimits the slot in the circuit board in respect of the surface directions thereof forms a projection. When the reflector is fully inserted, this projection engages into a hole in the reflector and thus prevents it from slipping out. The slot in the circuit board preferably widens towards an outer edge of the circuit board, which facilitates insertion of the reflector. In the end position, there are then preferably three contact regions between the inserted reflector and the slot flanks. One of the contact regions is arranged on one of the two slot flanks; the two other contact regions are located on the opposite slot flank, namely on either side of the first-mentioned contact region, in relation to the longitudinal extent of the slot. The contact regions stabilize the reflector in its straight extent.

With regard to the preferably planar form of the reflector, reference is made to the above disclosure. The circuit board is also preferably planar, at least apart from an applied layer system, such as, for example, the conductive track structure, that is to say a local topography; for example, at least a substrate (see below in detail) of the circuit board should be planar, the circuit board then being referred to as planar.

In a preferred embodiment, in the case of the particular reflected light the directional component that increases the light distribution in the surface direction (the main propagation direction of the reflected light) should be dominant; the directional component perpendicular thereto should account for, for example, not more than 50%, 25% or 15% of the directional component parallel to the surface direction. At least in an idealized view, the directional component perpendicular to the surface direction can also be equal to zero, namely in the case of perfectly diffuse reflection.

In a preferred embodiment, the particular light is reflected diffusely by the reflector, namely perfectly diffusely within the scope of what is technically possible. Ideally, the reflection produces a kind of virtual light source which emits substantially at a right angle to the LED emitting the reflected light and thus provides light to the surface directions. The "particular" reflected light comes in each case from precisely one of the LEDs.

The main propagation direction of the particular reflected light is tilted relative to the particular LED main propagation direction preferably by at least 20°, at least 30°, 40°, 50°, 60°, 70° or 80° being further lower limits with increasing preference in the order given (this preferably also applies to a third and fourth LED, see below).

Independently thereof, possible upper limits may be, for example, not more than 140°, 120° or 100° (with increasing preference in the order given).

In a preferred embodiment, the LEDs are each spaced apart from an edge, at which the side surface of the circuit board having the particular LED and the side surface of the reflector on which the light emitted by the particular LED is incident, adjoin one another, by not more than 8 mm, with increasing preference in this order by not more than 7 mm, 6 mm, 5 mm, 4 mm or 3 mm The distance is taken along a surface direction of the circuit board; the smallest distance is considered, that is to say, for example, the distance between a side wall of the LED facing the edge and parallel to the edge and the edge, or the distance between a corner of the LED facing the edge and the edge.

The inventors have found that, by correspondingly placing the LEDs as close as possible to the reflector, good distribution of the light in the surface directions can be achieved. A lower limit for the distance may also be, for example, 0.5 mm or 1 mm, due to the installation. The distances disclosed above and below for the first and second LED are also preferred for a third and fourth LED (see below). Particularly preferably, all the LEDs of the lighting means are arranged at a corresponding maximum distance (disclosed above/below) from the respective edge, wherein the above-mentioned minimum distances (0.5 mm or 1 mm) are also to be disclosed as preferred in this respect.

In a preferred embodiment, which likewise relates to the distance of the particular LED from the particular edge, the smallest distance between the LED and the edge should correspond to not more than 0.3 times an average extent d of a side surface of the reflector, with not more than 0.2 times being further preferred and not more than 0.1 times being particularly preferred. The average extent d is formed as the average of the extents taken in each case perpendicularly away from the edge to a margin of the side surface, that is to say averaged over the extents taken along the edge.

In a preferred embodiment, the circuit board having the LEDs is so arranged in the outer bulb that the LED main propagation directions enclose an angle of at least 80°, preferably at least 85°, and not more than 100°, preferably not more than 95°, with a longitudinal direction parallel to the outer bulb longitudinal axis and facing away from the base towards the outer bulb; particularly preferably, the LED main propagation directions are in each case perpendicular to the outer bulb longitudinal direction. The outer bulb longitudinal axis passes through the base; preferably, the outer bulb is radially symmetrical, particularly preferably rotationally symmetrical, about the longitudinal axis.

Preferably, therefore, the particular LED main propagation directions and further preferably also the particular main propagation directions of the particular reflected light are within the above-mentioned limits, that is to say substantially perpendicular to the outer bulb longitudinal axis. The redistribution by reflection thus takes place in respect of a circular path about the outer bulb longitudinal axis. Preferably, the circuit board and the reflector intersect, and a corresponding region of intersection, which can be regarded approximately as a line of intersection, contains the outer bulb longitudinal axis over its length, thus in particular the corresponding slot or slots (see above) contain the outer bulb longitudinal axis in each case over their length.

In a preferred embodiment, a third and a fourth LED are additionally provided, wherein the first and the third LED are arranged together on the same side of the circuit board and also the second and the fourth LED are arranged together on the same side of the circuit board (opposite the first and third LED). The reflector then extends between the LEDs in such a manner that the light from the LEDs arranged on the same side of the circuit board is in each case incident on mutually opposite sides of the reflector. The light from the first LED is incident on one side surface of the reflector, and the light from the third LED is incident on the opposite side surface; likewise, the light from the second LED is incident on one side surface of the reflector and the light from the fourth LED is incident on the opposite side surface (the light from the first and second LED is incident on the same side surface of the reflector, and the light from the third and fourth LED is incident on the same side surface, opposite the above-mentioned side surface). Further preferably, the first and the fourth LED and the second and the third LED are arranged radially symmetrically to one another with respect to the outer bulb longitudinal axis, in each case by 180°.

Preferably, the cross-wise arrangement of the circuit board and the reflector thus results in four quadrants which follow one another in the circular path direction (based on a circular path around the outer bulb longitudinal axis), and there is associated with each quadrant at least one LED, some of the light of which is redistributed by the reflector (the light distribution is homogenized with respect to the circular path direction). Where reference is made to a first and second or third and fourth LED, this generally specifies in each case a minimum number of LEDs, which should be arranged accordingly. It is thus also possible, for example, for a plurality of LEDs, for example at least 2, 3, 4 or 5 LEDs, per quadrant to be associated with the reflector; possible upper limits may be, for example, in each case not more than 15 or 10. In general, further LEDs that are not associated with the reflector in the corresponding manner can also be provided, but in each case preferably at least 20% of the light from all the LEDs of the lighting means is incident on the reflector and is reflected at the reflector in a manner described herein.

In a preferred embodiment, a part region of the reflector is partially separated from the remainder of the reflector, that is to say by means of an open (unclosed) parting line, and is folded out relative to the remainder of the reflector in such a manner that light reflected at the reflector part region has a main propagation direction with a dominant directional component parallel to the outer bulb longitudinal axis. A fold line, about which the part region is folded out, extends, for example, from one end point to the other end point of the unclosed parting line. The parting line can be stamped, for example.

The folded-out part region should be small in relation to the remainder of the reflector, that is to say have a surface area of the reflector as a whole of not more than 30%, with increasing preference in this order not more than 25%, 20%, 15%, 10% or 5%. A plurality of part regions may also be folded out, but preferably not more than two. If a plurality of part regions are folded out, the total surface area thereof in the reflector as a whole is preferably not more than 30%, whereby the upper limits mentioned above are also preferred and are to be disclosed in this case too.

By means of the folded-out part region(s), directions around the outer bulb longitudinal axis can thus advantageously be provided with light, that is to say homogenization by reflection can thus be achieved not only in respect of the circular path direction. Apart from the folded-out part region(s), the remainder of the reflector is preferably planar.

In a preferred embodiment there is provided an additional transverse reflector which, as a previously separate part, is assembled with the circuit board and the reflector; in this respect, reference is made to the above disclosure relating to the "assembly" of the circuit board and the reflector, which is also to be disclosed in relation to the transverse reflector. The transverse reflector extends transversely to the outer bulb longitudinal axis, preferably with a surface area of, with increasing preference in this order, at least 30%, 50%, 70% or 90% perpendicular thereto; particularly preferably it extends fully perpendicularly to the outer bulb longitudinal axis.

The transverse reflector is preferably produced from the same material or material composite as the reflector, and reference is made generally to the above disclosure relating to the reflector, for example with regard to a preferred flat and planar form of the transverse reflector.

The transverse reflector can have, for example, a surface area, taken in its surface directions, of at least 1 $cm^2$, 3 $cm^2$ or 5 $cm^2$, possible upper limits (independently of the lower limits) are, for example, not more than 20 $cm^2$, 15 $cm^2$ or 10 $cm^2$. In general, that is to say also independently of the presence of a transverse reflector, the surface area of the reflector, taken in the surface directions thereof, can be, for example, at least 4 $cm^2$, 6 $cm^2$, 8 $cm^2$, 10 $cm^2$, 12 $cm^2$, 14 $cm^2$ or 16 $cm^2$, possible upper limits (independently of the lower limits) are, for example, not more than 30 $cm^2$, 25 $cm^2$ or 20 $cm^2$. The surface area of a planar reflector can, for example, also be determined at a perpendicular projection of the particular reflector (reflector or transverse reflector) in question into a plane perpendicular to its thickness direction, namely as the total surface area enclosed by the outer edge of this projection.

In a preferred embodiment, the LEDs each emit light with a light distribution whose full width at half maximum is greater than 120°, preferred lower limits, with increasing preference in this order, being at least 130°, 140° or 145°. LEDs with Lambertian light distribution (full width at half maximum of 120°) are thus not used; instead, there are used, for example, LEDs whose light in each case already originally fills a solid angle which is greater than a half-space. Possible upper limits of the full width at half maximum of the light distribution of the particular LED light may be, for example, not more than 180°, 170° or 160°.

In general within the scope of this disclosure, but in particular in this context, "LED" preferably means a housed LED chip, which is thus, for example, partially encapsulated in potting material. Light emission beyond the half-space in which the LED main propagation direction points can be achieved, for example, by a housing having side wall surfaces which are transmissive for the LED light. Regardless of the specific implementation, the inventors have observed a particularly pronounced homogenization in respect of the circular path direction for LEDs with a correspondingly wide light distribution; the directions around the outer bulb longitudinal axis can thus optionally also be better provided.

In a preferred embodiment, the light distribution of the lighting means is so homogenized that the light intensity measured on a circular path around the outer bulb longitudinal axis (at an elevation angle of 90°, that is to say perpendicular to the longitudinal direction of the outer bulb) exhibits at most a slight variation. Any light intensity value taken on this circular path should thus represent at least 30%, preferably at least 25%, of a maximum value of the light intensity taken on the circular path. Preferably, the light intensity also exhibits a correspondingly small variation at other (but always constant, for each circular path) elevation angles.

Preferably, in all directions which enclose an angle of between 0° and a critical angle with the outer bulb longitudinal direction (see above), a light intensity other than zero is still measured, which preferably represents at least 10%, further preferably at least 20% or 30% of a maximum light intensity. The critical angle is, with increasing preference, greater than 90°, 100°, 110°, 120°, 130°, 140°, 150° or 160°; at angles greater than 170°, the light intensity can be zero.

In a preferred embodiment, the circuit board is composed of a substrate, for example FR4, the mutually opposite sides of which are provided with structured conductive track material, preferably copper, which forms the conductive track structure. The substrate is flat and preferably planar, thus the mutually opposite side surfaces of the substrate each lie in a plane, which planes are parallel to one another (and spaced apart from one another by the substrate thickness). Preference is given to a non-electrically conductive substrate, to which the conductive tracks are further preferably applied directly.

Further preferably, the conductive tracks, which are particularly preferably produced from copper, have a thickness, taken perpendicularly to the surface directions of the circuit board, of at least 35 µm, with increasing preference in this order at least 50 µm, 75 µm, 100 µm, 125 µm, 150 µm, 175 µm, 200 µm, 225 pm or 250 µm. Possible upper limits may be, for example, not more than 750 µm, 500 µm, 400 µm or 300 µm. With conductive tracks that are correspondingly as thick as possible, good heat dissipation from the LEDs can be achieved, for example. On the other hand, the present concept, that is to say the provision of a circuit board equipped with LEDs on both sides in combination with a reflector, also actually permits the use of correspondingly thick conductive tracks, because the system as a whole is nevertheless still optimized in terms of cost. Correspondingly thick conductive tracks can also be technically problematic in the prior art mentioned at the beginning with the three-dimensional carrier. In general, it is preferred that the circuit board having the LEDs is the only circuit board of the lighting means that is equipped with LEDs.

Independently of the thickness or configuration specifically, the conductive tracks of the circuit board can preferably be covered at least in part with a reflective layer (with regard to the preferred material properties and reflection properties thereof, reference is made to the above disclosure relating to the reflector having a core). The reflective layer preferably then covers the circuit board completely on both sides, apart from windows for each of the LEDs. Such a window should, for example, be not more than 10% or 50% larger than the base area of the LED arranged therein.

The circuit board can also be composed of a plurality of substrate layers, that is to say at least two and preferably not more than four or three, particularly preferably exactly two substrate layers. The preferably two substrate layers are preferably each provided on one side with conductive tracks, thus one side surface of each substrate layer is free of conductive tracks; the substrate layers are then further preferably assembled with their LED-free side surfaces facing one another, so that the outer side surfaces of the resulting multilayer substrate are then provided with the conductive tracks. The substrate layers are integral with one another so that they cannot be separated from one another without damaging one of them or a part connecting them, in particular a connecting layer. In general, they can also simply be in contact with one another, they are preferably connected together by a material-based joint connecting layer, particularly preferably an adhesive layer.

The substrate layers can be produced, for example, from the above-mentioned FR4, thus the circuit board can be assembled, for example, from two circuit board parts each provided on one side with conductive tracks. The conductive tracks of the two circuit board parts can then be electrically conductively connected to one another, for example, by means of a clamp as connector. The substrate layers are preferably produced from a polyester material, polyethylene terephthalate (PET) is particularly preferred. The substrate layers can, for example, each have a thickness of at least 150 µm, 200 µm or 250 µm and (independently thereof) of, for example, not more than 500 µm, 450 µm, 400 µm or 350 µm, in each case with increasing preference in the order given (the thickness is generally considered to be an average, it is preferably constant).

It can be preferred that the substrate layers are/have been formed from a substrate sheet which is/has been laid back on itself; the substrate sheet is preferably folded back on itself about a fold line. The substrate sheet is preferably laid or folded back with the LEDs already mounted thereon, which allows one-sided equipping (of the substrate sheet) while nevertheless resulting in a multilayer substrate equipped on both sides. Such an advantage can moreover also arise if, as described above, two circuit board parts each provided with conductive tracks on one side are assembled and are already each equipped with LEDs when assembled.

It is also possible that an LED is arranged on a surface part of the circuit board which is so tilted relative to the remainder of the circuit board that the LED main propagation direction of the LED arranged thereon has a dominant directional component along the outer bulb longitudinal axis, thus an angle range about the outer bulb longitudinal axis is already originally provided with light by this LED. Such a surface part can be, for example, a part region of an above-mentioned substrate layer which has been folded out about a bridge region relative to the remainder of the substrate layer. The surface part/part region can be folded out relative to the remainder of the circuit board, for example, by an angle of at least 80° and preferably not more than 100°, particularly preferably exactly 90°. Although this is a possibility for providing the directions around the outer bulb longitudinal direction, preferably all the LED main propagation directions of all the LEDs mounted on the circuit board, preferably of all the LEDs of the lighting means as a whole, point in one of two exactly mutually opposite directions (which are perpendicular to the circuit board).

In general, the circuit board preferably has a width, taken in one of the surface directions, of not more than 30 mm, with not more than 25 mm being further preferred and not more than 20 mm being particularly preferred. Possible lower limits can be, for example, at least 15 mm or 18 mm In a surface direction perpendicular to the above-mentioned surface direction, the circuit board preferably has a length of not more than 60 mm, with not more than 55 mm being further preferred and not more than 50 mm being particularly preferred. The mentioned upper limits are to be understood as meaning that the circuit board, in the case of the width, has a width over its entire length that is smaller than/equal to the upper limit, and in the case of the length has a corresponding length over the entire width.

In a preferred embodiment, a glass outer bulb is provided, and this glass outer bulb delimits a sealed volume. The sealed volume is preferably filled with a filling gas which has a higher thermal conductivity compared to air (the gas mixture of the earth's atmosphere at sea level) (generally, however, such a filling gas could also be provided, for example, in a plastics outer bulb coated on the inside). The filling gas can contain helium, for example, namely in a greater proportion than air, for example in a proportion of, with increasing preference in this order, at least 30 vol. %, 40 vol. %, 50 vol. %, 60 vol. %, 65 vol. %, 70 vol. %, 75 vol. %, 80 vol. %, 85 vol. %, 90 vol. %, 95 vol. % or 99 vol. %. The helium in the filling gas can be mixed, for example, with air and/or nitrogen and/or oxygen and/or an oxidative gas such as, for example, $Cl_2$, $Br_2$, $F_2$, $SF_6$ or also with an organic gas.

The filling gas preferably contains oxygen, for example in a proportion of at least 10 vol. %, preferably at least 12.5 vol. %; possible upper limits (independently thereof) may be, for example, not more than 20 vol. % or not more than 17.5 vol. %. The filling gas thus preferably contains helium and oxygen, particularly preferably it consists only thereof (within the scope of technically usual degrees of purity). In general, however, it could also contain hydrogen in a higher proportion compared with air, optionally also as an alternative to helium or in admixture therewith.

In a preferred embodiment, the circuit board having the LEDs is then arranged wholly within the filling gas volume delimited by the glass outer bulb, thus it does not extend through the outer bulb wall. Further preferably, it is also spaced apart from an inner wall surface of the outer bulb delimiting the filling gas volume, thus it is not in contact therewith.

In a further embodiment of the circuit board arranged wholly within the filling gas volume, at most a portion of a driver electronics is arranged thereon, thus at least not the entire driver electronics is arranged on the circuit board. The circuit board can, for example, also be wholly free thereof, so that only the LEDs, for example, are thus then arranged thereon and electrically conductively connected to the conductive track structure.

The driver electronics preferably nevertheless integrated into the lighting means is then arranged, for example, in the base, for example on a second circuit board. By not providing a driver electronics within the filling gas volume (the filling gas volume is free thereof), it is possible to prevent, for example, contamination of the filling gas, which could damage the LEDs, for example. When designing the driver electronics, it is then not necessary to give separate consideration to whether, for example, components of the housing technology (for example the potting compound) outgas; thus expensive special components do not have to be used, which can help to optimize costs in particular in respect of mass production.

Alternatively to the arrangement of the entire driver electronics in the base, the driver electronics can, however, also be divided, for example, by locating one portion thereof outside the filling gas volume (preferably in the base) and another portion thereof on the circuit board having the LEDs. This can be advantageous, for example, for reasons of space, for example if, with a given base size, only limited space is available therein. It is then possible to arrange, for example, at least electrolytic capacitors and coils in the base outside the filling gas volume; inside the filling gas volume, diodes, resistors, ICs and ceramics capacitors, for example, can be arranged. Such a division can, however, also depend specifically on the components used in a particular case. Components that contain an unencapsulated (not encapsulated) potting compound are preferably located outside the filling gas volume (encapsulation can help to prevent outgassing).

In general, the circuit board preferably has a width, taken in one of the surface directions, of not more than 30 mm, with not more than 25 mm being further preferred and not more than 20 mm being particularly preferred. Possible lower limits may be, for example, at least 15 mm or 18 mm. In a surface direction perpendicular to the above-mentioned surface direction, the circuit board preferably has a length of not more than 60 mm, with not more than 55 mm being further preferred and not more than 50 mm being particularly preferred. In the lighting means, the circuit board is preferably so oriented that its width is taken perpendicularly to the outer bulb longitudinal axis. The longitudinal extent of the circuit board is then parallel to the outer bulb longitudinal axis.

The mentioned upper limits are to be understood as meaning that the circuit board, in particular in the case of the width, has a width over its entire length that is smaller than/equal to the upper limit. This preferably applies analogously to the lower limit and/or correspondingly to the upper/lower limit of the length. Although as large a circuit board as possible may generally be preferred for thermal reasons, for example, it can be advantageous to limit the width of the circuit board because the lighting means can thus be produced using manufacturing steps of a conventional filament bulb.

It is possible, for example, comparably to the manufacture of filament bulbs, to provide a glass bulb which tapers to an opening—instead of a lamp base with a glow filament there is then used, for example, a lamp base with a circuit board. The circuit board, which is limited in width, can thereby be introduced through the opening of reduced diameter (reduced due to the taper). From the production point of view, compatibility with existing process steps or intermediate products is thus achieved.

In a preferred embodiment, the reflector has a lower bending stiffness than the circuit board. The preferably planar reflector can be bent relative to its plane more easily than can the preferably planar circuit board; in simple terms, "a plane" refers to the two mutually parallel planes in which the planar side surfaces lie. The circuit board is preferably rigid to the extent that it cannot in any case be macroscopically (in the centimeter range) resiliently deformed, but would then break. Ideally, the reflector can be macroscopically resiliently, that is to say reversibly, deformed, thus can be bent out of its plane and then subsequently (after the force causing the bending has been removed) assume its planar form again.

This can have advantages, for example, in that the reflector can thus be temporarily deformed as it is inserted as described above into a glass bulb having an opening of reduced diameter, but then assumes its original shape again in its final position in the bulb. Accordingly, when sizing the reflector, the diameter of the glass bulb opening does not have to be considered or has to be considered to only a reduced extent; in other words, the reflector can be optimized in respect of its optical properties, that is to say can be made as large as possible, for example. Preference is given to a reflector which, at least in some regions, has a width, taken perpendicularly to the outer bulb longitudinal axis, which is greater than the closed glass bulb opening in the finished lighting means. The reflector preferably has at least in some regions a greater width than the circuit board, for example at least 10%, preferably at least 20%, greater; possible upper limits are, for example, not more than 100% or 50%.

In a preferred embodiment, the preferably frosted outer bulb, for frosting, is frosted on the inside in a scratch-resistant manner (see above), either by means of surface roughening or preferably by means of a scratch-resistant coating. The frosting should be "scratch-resistant" to the extent that contact with the reflector does not leave behind any marks which are visible to the naked eye. Any scratches should thus at most be "microscopic", that is to say be within the submillimeter range. The scratch-resistant frosting should in particular not chip extensively on contact with the reflector.

In relation to the handling of the finished lighting means by a user, although the frosting coating is already protected by being arranged on the inner surface of the outer bulb, the provision of a scratch-resistant coating can advantageously prevent the coating from being damaged during assembly of the lighting means, in particular can prevent scratching by the reflector which is temporarily deformed during introduction and may graze the inner surface of the outer bulb.

In a preferred embodiment there is provided a carrier with which the circuit board is assembled (see the above disclosure regarding "assemble"). The carrier is in turn preferably supported on a lamp base (see below) made of glass. The carrier is preferably produced from a plastics material, for example polyamide (PA), preferably it is an injection molded part. In general, the carrier could also be wholly a plastics part, but an insert of metal is preferably provided. This may be a clamp, for example, by means of which the carrier is seated on the lamp base. Preferably, the reflector is also assembled directly with the carrier, that is to say not only indirectly via the circuit board. For that purpose, a slot is preferably provided in the carrier, into which slot the reflector is inserted.

Current leads which provide the electrical contact between the base and the circuit board are preferably also guided via the carrier. In general, the carrier itself could also be provided with conductive tracks, but preferably wires passing through the lamp base as current leads are guided via the carrier and pressed by the carrier against the circuit board, preferably in each case by a locking projection of the carrier, which then at the same time holds the circuit board in position and to that end engages in a corresponding recess in the circuit board. Such locking between the carrier and the circuit board is generally preferred, that is to say also independently of the simultaneous pressing of a wire. The carrier preferably has locking projections which are located in pairs opposite one another in relation to the thickness direction of the circuit board and which thus engage in the opposing sides of the circuit board. Two such pairs of locking projections are preferably provided on the carrier, namely on either side of the reflector.

In general, regardless of the manner in which the carrier and the circuit board are fastened together, or whether a carrier is provided at all, a current lead providing the electrical contact between the base and the circuit board can in a preferred embodiment be soldered to the circuit board. The current lead is then preferably a wire soldered to the circuit board. The current lead can thereby also be guided through the carrier, thus can pass through the carrier; in general, it could also be formed, for example molded, therewith, preferably it is threaded through a through-opening. Two correspondingly configured current leads are preferably provided.

It can also be preferred that an above-mentioned transverse reflector is formed as an integral part of the carrier, preferably injection molded in one step with the remainder of the carrier (provided the carrier is produced from plastics material). The transverse reflector and the remainder of the carrier are thus then monolithic with one another.

Looking at the lighting means perpendicularly to the outer bulb longitudinal axis, there can be provided in preferred embodiments between the outer bulb and the base a peripheral spacer, preferably made of a plastics material, particularly preferably an injection molded part. The spacer can, for example, be inserted into the base made of metal, the outer bulb then in turn being seated in the spacer. In this manner, for example, a volume available in the base for accommodating a driver electronics can be made larger. The part of the spacer that is visible when the lighting means is viewed perpendicularly to the outer bulb longitudinal axis can represent, based on a total length of the lighting means taken along the outer bulb longitudinal axis, for example, at least 3%, preferably at least 5%, and (independently thereof), for example, not more than 10%, preferably not more than 8%, of the total length.

As already mentioned at the beginning, the invention relates also to a method for producing a lighting means disclosed herein, wherein the circuit board and the reflector are provided as separate, individually handled parts and then assembled. When the reflector and the circuit board are assembled, the circuit board is preferably already equipped with the LEDs and optionally also with a driver electronics. With regard to further advantageous variants, reference is made explicitly to the above disclosure.

As already described at the beginning, in a preferred embodiment the reflector is temporarily resiliently deformed as it is introduced into the glass bulb and then assumes its original shape again. The reflector can thus be designed with a width, taken perpendicularly to its introduction direction, which is preferably parallel to the outer bulb longitudinal axis, that is not limited by the opening in the glass bulb. In the production context, "glass bulb" in the present case refers to a preliminary stage of the outer bulb which is characterized by the opening on one side, to which the glass bulb tapers. By closing the opening of the glass bulb, the outer bulb delimiting a closed volume is produced, the tapering, that is to say pear-shaped, form preferably remaining unchanged.

The glass bulb opening does not necessarily have to be closed in a single step. Preferably, the circuit board and the reflector are held in a lamp base made of glass, which is placed at the opening and fused with the glass bulb. The lamp base thereby closes the opening, but preferably not yet completely; instead, it still provides a channel through which the inner volume of the glass bulb is accessible to compressed fluid. The filling gas is introduced into the inner volume of the glass bulb via the channel, and then the channel is closed, preferably by fusion of glass. Before the filling gas is introduced, the inner volume of the glass bulb is preferably at least partially evacuated via the channel Current leads, for example of wire, which are electrically conductively connected to the circuit board, preferably already pass through the lamp base of glass when it is positioned at the opening of the glass bulb, via which current leads the LEDs are thus electrically operable/contactable. After the lamp base has been fixed in place, and preferably also after the glass bulb has been closed, the base is then electrically conductively connected to the current leads and fitted to the outer bulb, for example connected thereto by a material-based connection, for example adhesively bonded.

The invention relates also to the use of a lighting means disclosed herein for a luminaire, wherein the base of the lighting means is fitted, preferably screwed, into a socket of the luminaire.

BRIEF DESCRIPTION OF THE DRAWINGS

The invention will be explained in greater detail below by means of exemplary embodiments, wherein the individual features within the scope of the further independent claims can also be essential to the invention in a different combination and furthermore a specific distinction is not made between the different claim categories.

The drawings show

PREFERRED EMBODIMENT OF THE INVENTION

Figure 1:
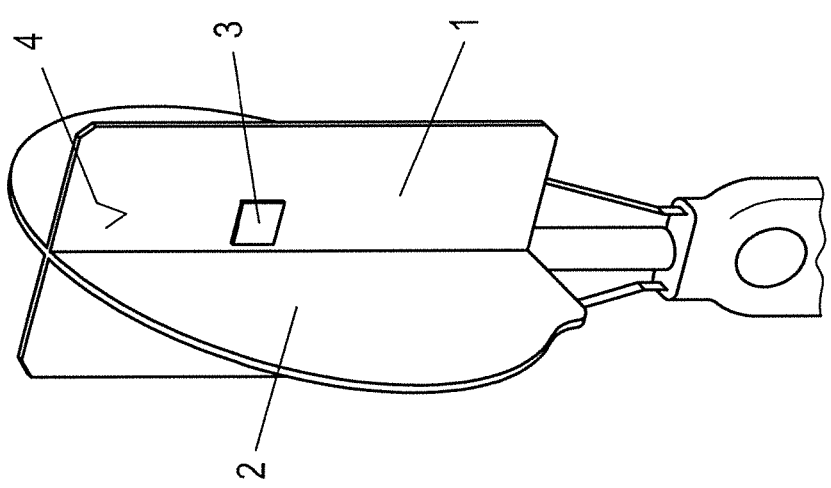
FIG. 1 circuit board and reflector of a lighting means according to the invention.

FIG. 1 shows a circuit board 1 with a reflector 2 in an oblique view. On the circuit board 1 there are arranged four LEDs 3, only one of which is visible for reasons of perspective. The LEDs 3, as SMD components, are electrically conductively connected to a conductive track structure of the circuit board 1, the conductive track structure being covered with a reflective layer forming a reflecting surface 4 (the reflective layer is open in the region of the LEDs 3, which is not shown in detail).

Figure 2:
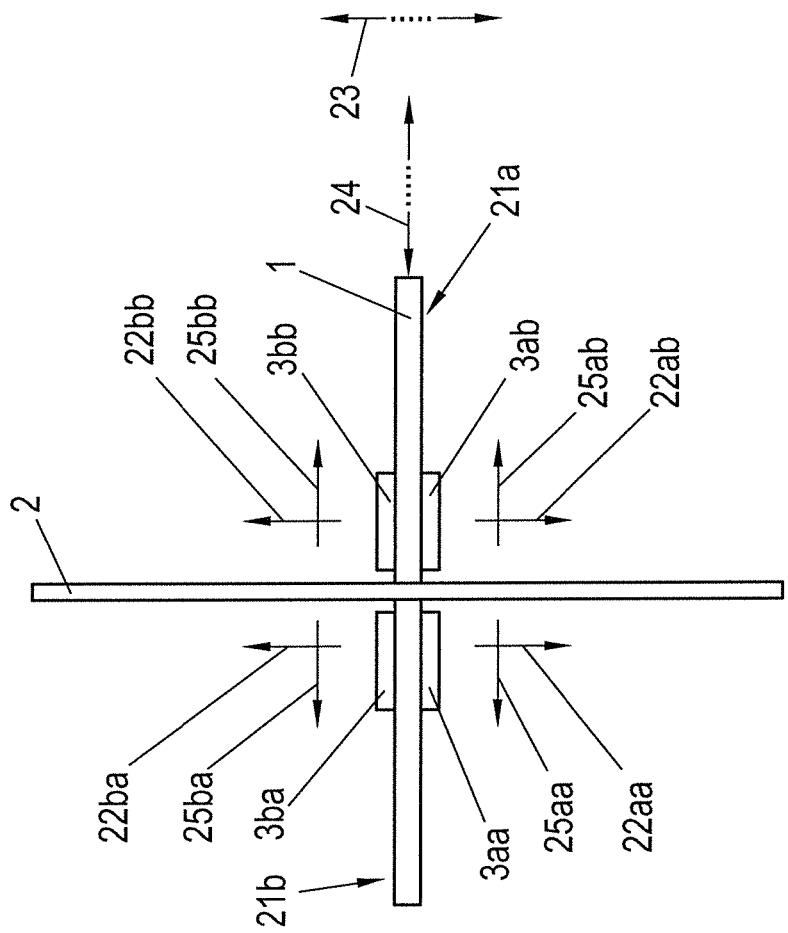
FIG. 2 the circuit board and the reflector according to FIG. 1, looking from above along a longitudinal axis of the outer bulb of a lighting means according to the invention.

The view according to FIG. 2 illustrates the arrangement of the circuit board 1 and the reflector 2 in a cross shape and in particular also the relative arrangement of the LEDs 3. A first 3aa and third LED 3ab are arranged on the same side 21a of the circuit board 1; a second 3ba and fourth LED 3bb are arranged on the opposite side 21b. Each of the LEDs 3 emits light with a particular LED main propagation direction 22. The LED main propagation directions 22aa, 22ab of the first 3aa and third LED 3ab are parallel to one another and opposed to the LED main propagation directions 22ba, 22bb of the second 3ba and fourth LED 3bb. This arrangement of the LEDs 3 on the mutually opposite sides 21 of the flat circuit board 1 is advantageous in terms of mounting, because it can be less expensive to equip both sides than to equip a three-dimensional arrangement.

However, with the mutually opposite LED main propagation directions 22, light would be emitted predominantly upwards and downwards in the representation according to FIG. 2, but the left and right side would be underprovided. In a reference system of the circuit board 1, a thickness direction 23 would preferentially be provided, while the surface directions 24 remained underprovided or even not provided at all. In order to redistribute light in the surface directions 24, the reflector 2 is therefore provided, which reflector is in the form of a monolithic plastics part, for example made of polybutylene terephthalate (PBT); on account of reflective particles embedded in the plastics material, the reflector has a degree of reflection of about 90% to 98%.

Some of the light from each of the LEDs 3 is then incident on the reflector 2 and is reflected thereby, namely in each case an amount of about 40%. The reflector 2 reflects the light diffusely, for which reason a particular main propagation direction 25 of the particular reflected light is then approximately at a right angle to the particular LED main propagation direction 22. The reflected light is thus distributed predominantly in the surface directions 24, which originally are scarcely provided or not provided at all.

FIG. 3 shows the light distribution in the far field, namely the radiant intensity I in dependence on the elevation angle, that is to say the angle θ in polar coordinates, the z-axis coinciding with the outer bulb longitudinal axis (see below) and the base of the lighting means being at +/−180°.

Figure 3A:
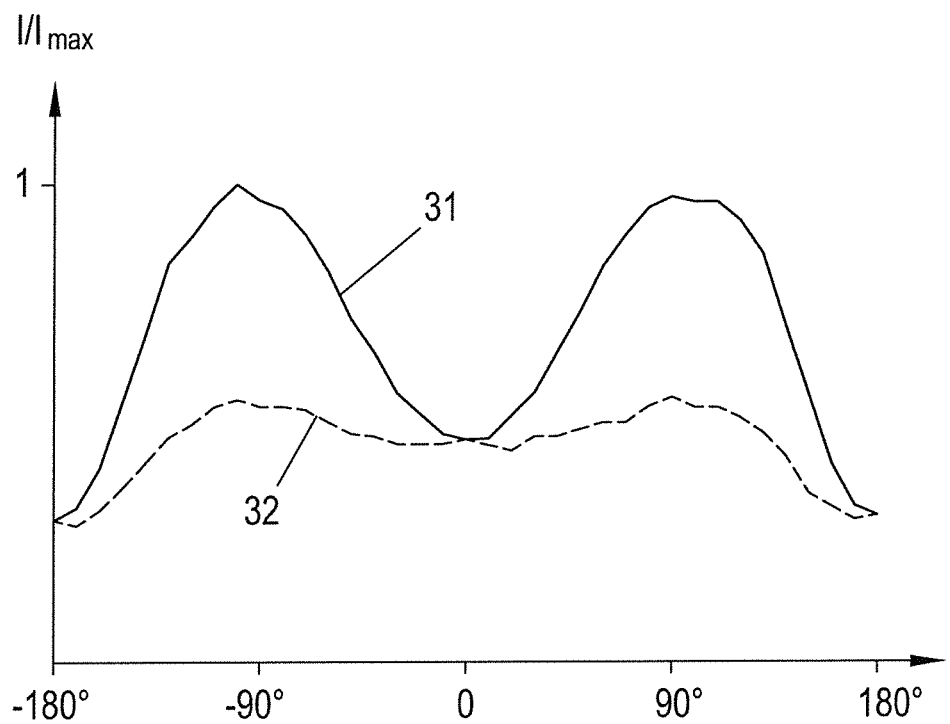
FIG. 3a, b light distribution curves to illustrate the redistribution of the light by the reflector.

FIG. 3a shows two light distribution curves of an arrangement, not shown in the present figures, of a reflector 2 and circuit board 1 with LEDs at a distance from the reflector 2 of in each case 9.5 mm, that is to say a relatively great distance. The curve 31 is taken at an azimuth angle (Φ angle in polar coordinates) at which, at an elevation angle of +/−90°, the particular LEDs 3 are viewed along the particular LED main propagation direction 22. The second curve 32, on the other hand, is taken at an azimuth angle at which the viewing direction is always perpendicular to the LED main propagation directions 22, that is to say comparable to the view in FIG. 2.

If the distance between the LEDs 3 and the reflector 2 is in each case large, the two curves 31, 32 are far apart, in particular at elevation angles around 90°. If a corresponding lighting means were thus to be viewed from the side, the particular radiant intensity reaching the observer would be greatly dependent on whether viewed from the top of the circuit board 1 (curve 31, high radiation intensity) or of the reflector 2 (curve 32, low radiation intensity).

Figure 3B:
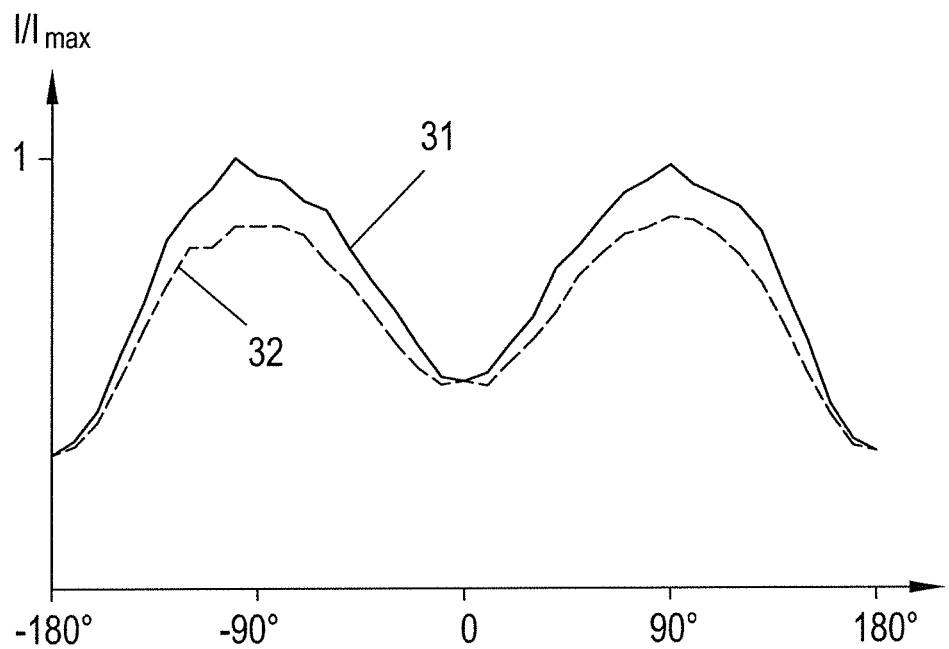

Like FIG. 3a, FIG. 3b is also based on a simulation, namely, with otherwise unchanged boundary conditions, with a reduced distance between the LEDs and the reflector of 2.5 mm and a circuit board of smaller width (of only 20 mm in contrast to about 56 mm in the simulation on which FIG. 3a is based). As a result, the dependency on the azimuth angle is significantly reduced, in other words the variation in the light intensity on a circular path around the outer bulb longitudinal axis (see below) is considerably smaller.

Figure 4:
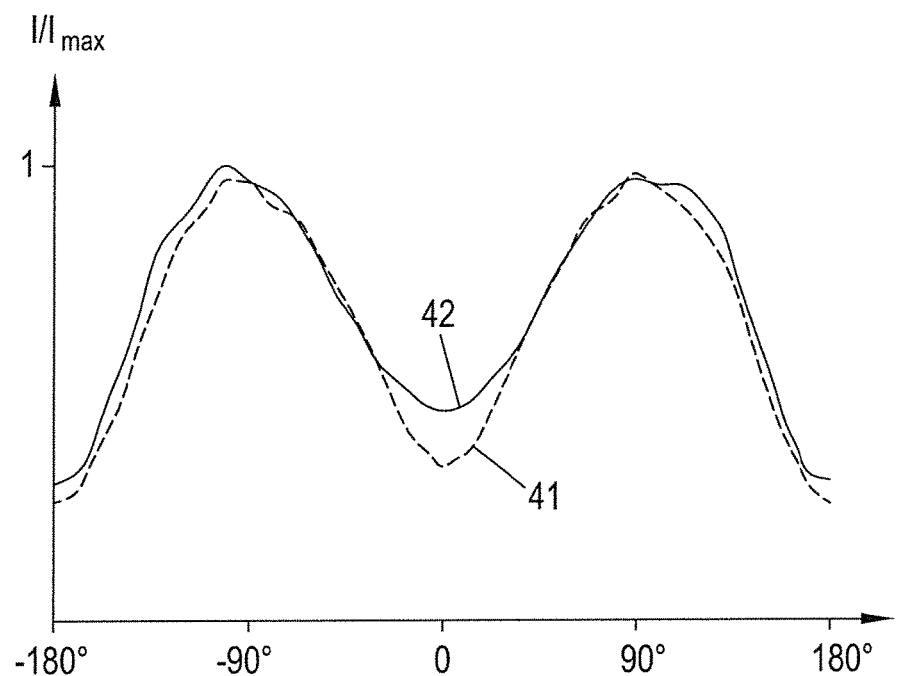
FIG. 4 light distribution curves to illustrate the effect of the light distribution of each individual LED.

FIG. 4 also shows two light distribution curves, wherein both curves are in this case taken at the same azimuth angle (front view of the LEDs 3 at an elevation angle of +/−90°, corresponding to curves 31 from FIG. 3) and the underlying circuit board/reflector geometry is also no different. However, in the simulation underlying the first curve 41, LEDs 3 each having Lambertian light distribution (full width at half maximum of 120° were used, whereas the LEDs 3 assumed in the simulation underlying the second curve 42 each had a light distribution with a full width at half maximum >120°. In the case of the second curve 42, each of the LEDs 3 filled a larger solid angle in comparison to a half-space. A direct comparison of curves 41, 42 shows that, in this manner, the local minimum at 0° can at least be reduced. A variation in radiant intensity, which occurs on passing through the elevation angle, is thus at least reduced.

Figure 5:
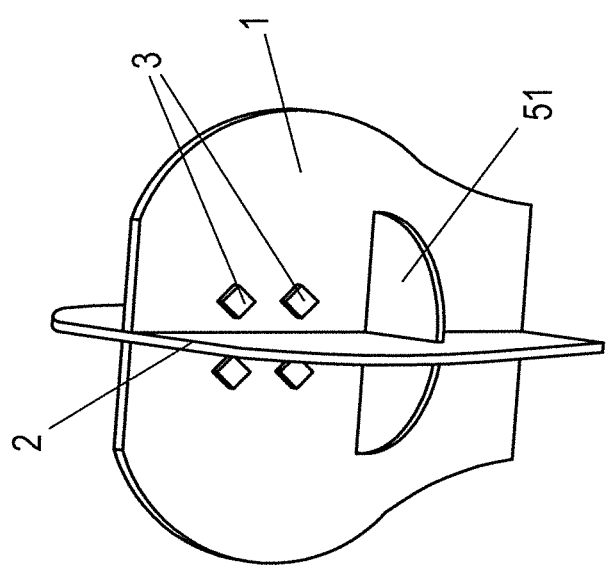
FIG. 5 an arrangement with a circuit board, a reflector and an additional transverse reflector.

The embodiment of FIG. 5 is also concerned with light redistribution in that direction, that is to say along the outer bulb longitudinal axis. FIG. 5 shows a circuit board 1 with LEDs 3 and a reflector 2; reference is made explicitly to the above description. Unlike in the arrangement discussed hitherto, in the present case each quadrant, which is created by the cross-wise arrangement of the circuit board 1 and the reflector 2, is not provided with only one LED 3 but with two LEDs 3. Furthermore, in addition to the reflector 2 a further reflector is provided, namely a transverse reflector 51, which extends perpendicularly to the outer bulb longitudinal axis. The transverse reflector 51 is to reflect some of the light with a directional component along the outer bulb longitudinal axis, that is to say upwards in FIG. 5.

Figure 6:
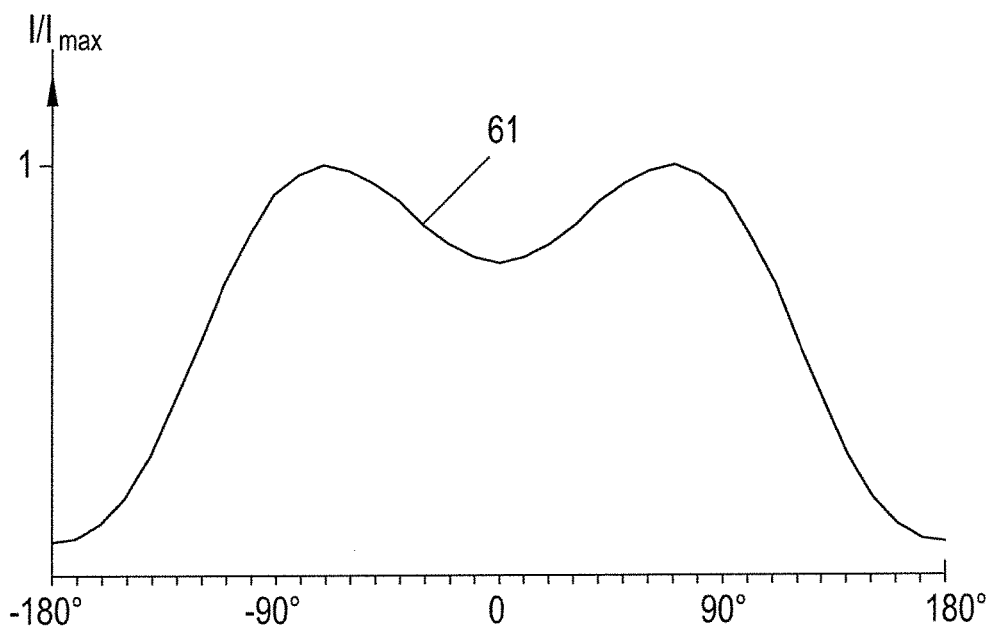
FIG. 6 light distribution curves for the arrangement according to FIG. 5 to illustrate the effect of the transverse reflector.

FIG. 6 shows a light distribution curve 61 taken on this arrangement, for the same azimuth angle as in FIG. 4 (front view of LEDs at an elevation angle of +/−90°). Although there is still a local minimum at 0° in the case of the transverse reflector 51 too, this is significantly reduced, as is shown by a comparison with curves 41, 42 according to FIG. 4.

Figure 7A:
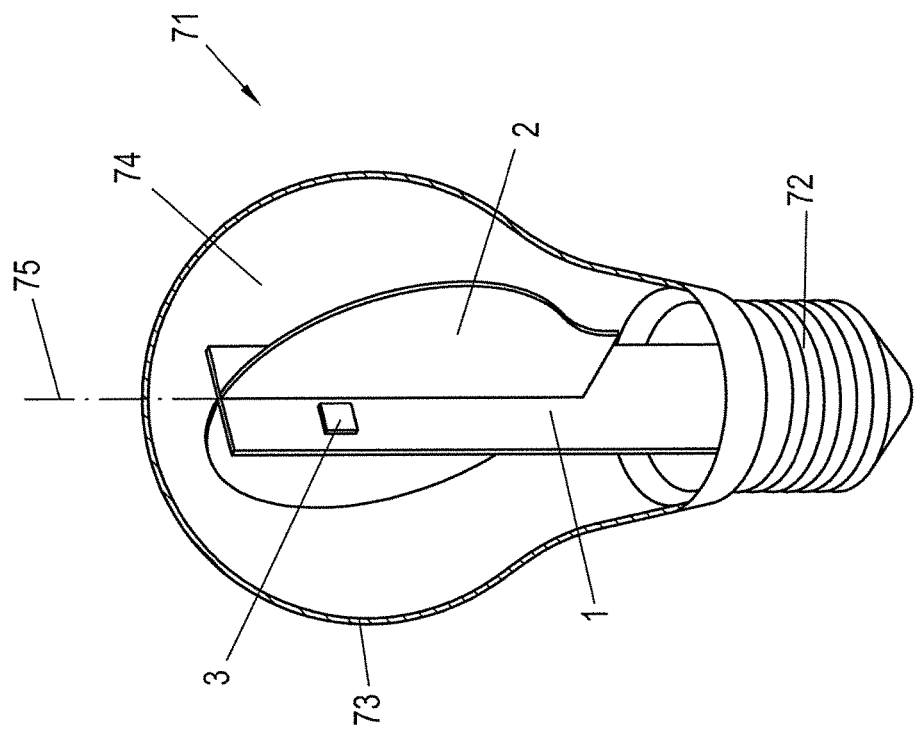
FIG. 7a, b two lighting means according to the invention which differ in the form of their particular reflector.

FIG. 7a shows a lighting means 71 according to the invention having the circuit board 1 equipped with LEDs 3, which circuit board is assembled with the reflector 2. The circuit board 1 is electrically conductively connected to an E27 screw base, on the base 72 there is seated an outer bulb 73 made of glass. The circuit board 1 and the reflector 2 are arranged in a closed volume 74 which is delimited by the outer bulb 73 and is filled with a filling gas (a helium mixture) with increased thermal conductivity as compared with air.

In the production of the lighting means 71 there is provided a glass bulb which already corresponds in shape to the outer bulb 73 but, unlike the outer bulb, is still open on the base side. The circuit board 1 and the reflector 2 already assembled therewith can be introduced through this opening. The reflector 2 has a width, taken perpendicularly to an outer bulb longitudinal axis 77, which is larger than the opening in the glass bulb. However, because the reflector 2 is made from a resiliently deformable plastics material, in the present case PET, it can be temporarily deformed, that is to say bent out of its plane, as it is inserted through the opening. It then assumes its original, planar shape again. The reflector 2 of the lighting means 71 according to FIG. 7a is designed with a smaller width than the lighting means 71 according to FIG. 7b, for which reason the latter must be deformed to a greater extent as it is introduced into the glass bulb.

When the circuit board 1 and the reflector 2 are introduced into the glass bulb, the circuit board is already mounted on a lamp base (not shown in FIG. 7), see FIG. 1 for illustration. Two current leads, namely two wires, which are each electrically conductively connected to the circuit board 1 pass through the lamp base made of glass. When the circuit board 1 and the reflector 2 are introduced into the glass bulb, the lamp base is positioned at the opening in the glass bulb in order to close the opening after fusion. However, the lamp base does not yet close the opening completely but provides a channel in its interior, through which channel the inner volume of the glass bulb is still accessible to compressed fluid; the inner volume is then first evacuated and then filled with the filling gas via the channel. The channel is then closed, whereby the circuit board 1 and the reflector 2 are held in a sealed volume 74 of the outer bulb 73.

The current leads protruding from the outer bulb 73 are then each electrically conductively connected to a driver electronics (not shown) arranged outside the outer bulb 73; the driver electronics is in turn electrically conductively connected to the base 72 and then also arranged therein. When a mains voltage is applied to the connecting points of the base 72, the driver electronics adapts it for operation of the LEDs 3. In a final step, the base 72 and the outer bulb 73 are assembled and, for example, fastened to one another by an adhesive bond.

Figure 7B:
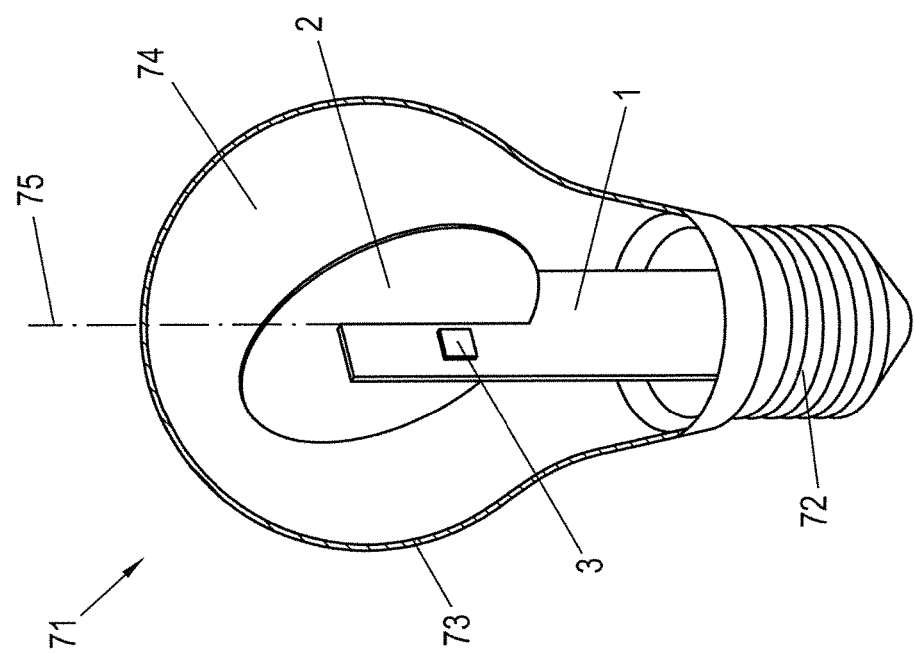

FIG. 7b also shows a lighting means 71 according to the invention which, apart from the shape of the reflector 2, corresponds to that according to FIG. 7a. In general, within the scope of this disclosure the same reference numerals denote parts having the same function, and in this respect reference is always made to the description relating to the other figures. In comparison with the lighting means 71 according to FIG. 7a, the reflector 2 in the lighting means 71 according to FIG. 7a is larger, both as regards its width taken perpendicularly to the outer bulb longitudinal axis 75 and in terms of its length taken parallel to the outer bulb longitudinal axis 75. The shape of the reflector 2 corresponds to the pear shape of the outer bulb 73, thus has in part a circular shape, which then merges on the base side into a neck which tapers to the base 72. By contrast, the reflector 2 of the lighting means 71 according to FIG. 7a is a circular disk.

Figure 8:
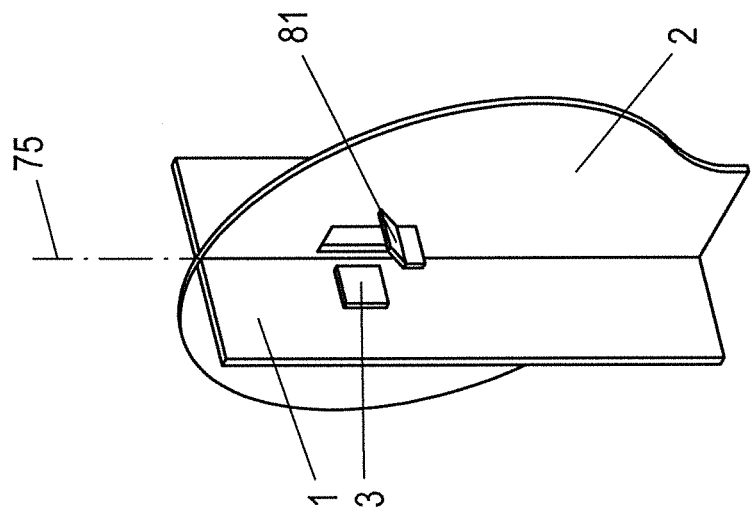
FIG. 8 a circuit board having a reflector, in which a part region has been folded out in such a manner that light is reflected at that part region along the outer bulb longitudinal axis.

FIG. 8 shows a combination of a circuit board 1 and a reflector 2 for a lighting means according to the invention, wherein a part region 81 has been folded out from the reflector 2. This part region 81 is stamped with an unclosed line, that is to say is not completely separated from the remainder of the reflector 2. The part region 81 is then folded out relative to the reflector 2 along a connecting web with the remainder of the reflector; a further fold line extends in the part region 81 itself.

As a result, the part region 81 provides an upwardly facing reflective surface. At least some of the light from the LED 3 that is incident on the reflector 2 is reflected upwards by the part region 81, that is to say with a directional component along the outer bulb longitudinal axis 75. The local minimum at an elevation angle of 0° (see FIGS. 4 and 6) can thus be reduced, that is to say the difference in radiant intensity relative to the adjacent maxima can be reduced.

Figure 9:
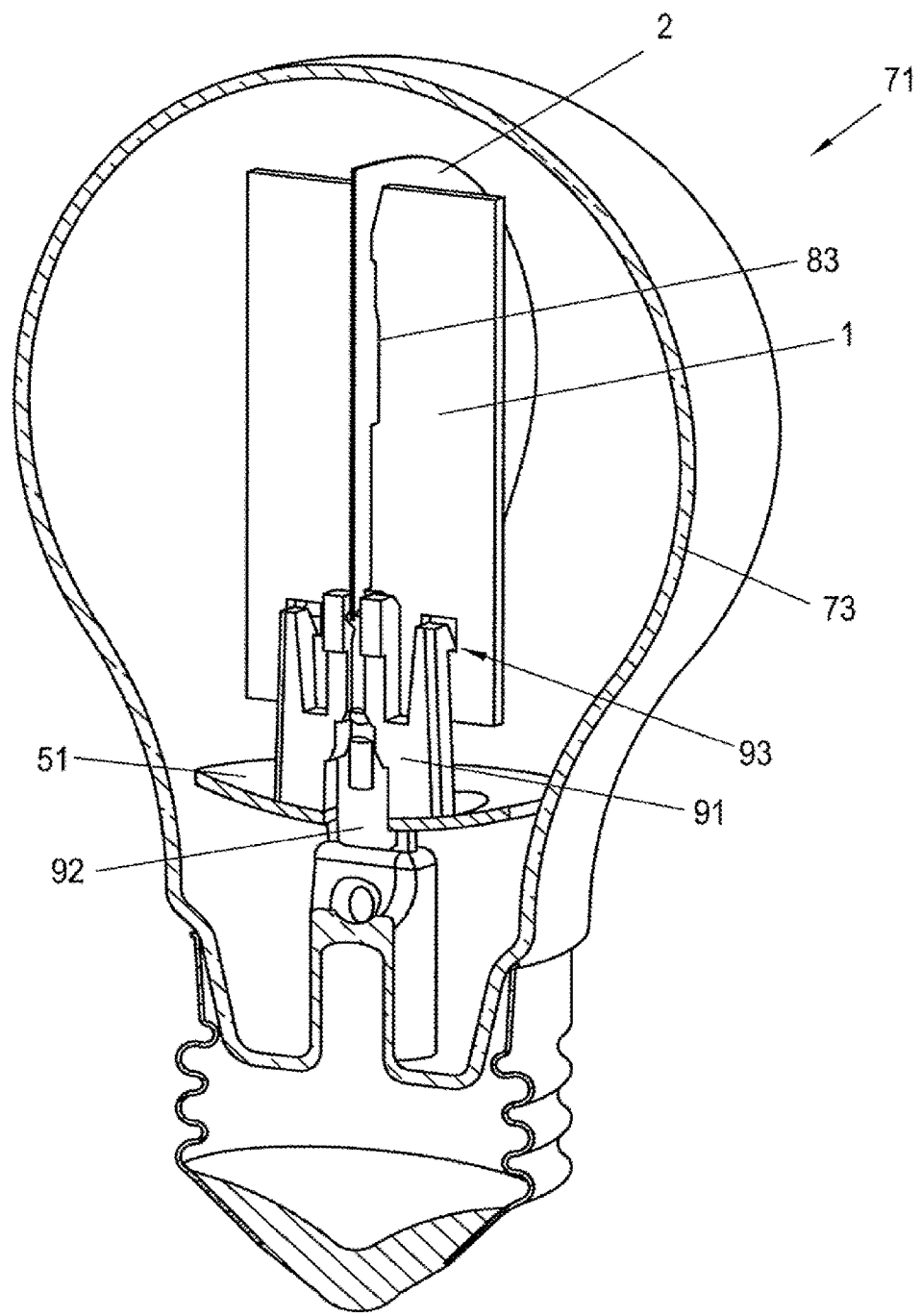
FIG. 9 a further lighting means according to the invention, in which the circuit board and the reflector are held in the outer bulb by a carrier.

FIG. 9 shows a further lighting means 71 according to the invention in a partially cutaway oblique view. The circuit board 1 is assembled with a carrier 91, which carries it in the outer bulb 73. The carrier 91 is an injection molded part of plastics material, which has a metal clamp (not shown). The metal clamp surrounds the exhaust tube 92 made of glass, thus is arranged between the glass and the plastics part of the carrier 91.

A total of four locking projections 93 are formed on the carrier 91, which locking projections are arranged in pairs opposite one another and accordingly engage in mutually opposite sides of the circuit board 1, in order to hold the circuit board in the inserted position. Furthermore, the carrier 91 is also provided with a slot 83, into which the reflector 2 is inserted. First the carrier 91 and the circuit board 1 are assembled, and then the reflector 2 is inserted.

At the end of the carrier 91 remote from the circuit board 1 and the reflector 2 there is formed a circumferential plate as a transverse reflector 51. The plastics material of the carrier 91 can be designed to be reflective overall by embedding reflective particles therein. With regard to the function of the transverse reflector 51, reference is made to the above disclosure.

Figure 10:
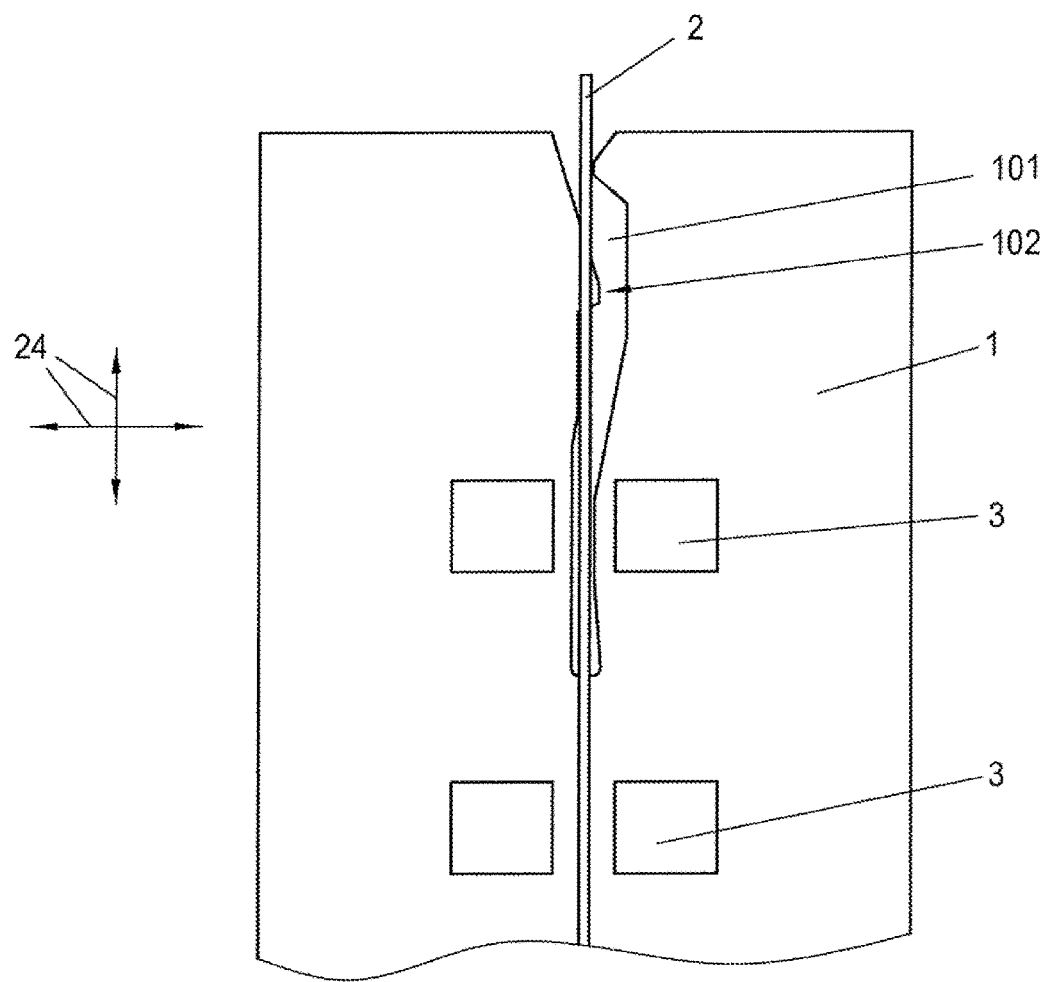
FIG. 10 a top view of the circuit board of the lighting means according to FIG. 9 to illustrate the slot with the reflector held therein.

FIG. 10 shows the circuit board 1 of a lighting means 71 according to the invention in a top view, namely looking along the LED main propagation directions. Accordingly, the reflector 2 can be seen from the side, looking at its narrow edge. FIG. 10 illustrates in detail the configuration of a slot 101 in the circuit board 1, into which slot 101 the reflector 2 is inserted. In order to facilitate insertion of the reflector 2 upon assembly, the slot 101 widens towards the outer edge of the circuit board 1.

When the reflector 2 has been inserted fully into the slot 101, a projection 102, which is formed by one of the slot flanks delimiting the slot 101 with respect to the surface directions 24, engages in the reflector 2. For that purpose, there is provided in the reflector 2 a through-hole (not visible in the side view) in which the projection 102 engages. Based on the surface directions 24, the reflector 2 in its end position then has three contact regions with the circuit board 1, that is to say with the slot flanks thereof delimiting the slot 101. The three contact points provide a straight extent for the reflector 2 in its end position.

LIST OF REFERENCE NUMERALS

Circuit board 1
Reflector 2
LEDs 3
First LED 3*aa*
Second LED 3*ab*
Third LED 3*ba*
Fourth LED 3*bb*
Reflective surface 4
Opposite sides of the circuit board 21*a*, *b*
LED main propagation directions 22*aa*, *ab*, 22*ba*, *bb*
Thickness direction 23
Surface direction of the circuit board 24
Main propagation direction 25
Curve 31
Curve 32
Curve 41
Curve 42
Transverse reflector 51
Light distribution curve 61
Lighting means 71
Base 72
Outer bulb 73
Filling gas volume 74
Outer bulb longitudinal axis 75
Reflector part region 81
Slot 83
Carrier 91
Exhaust tube 92
Locking projections 93
Slot 101
Projection 102

The invention claimed is:

1. A lighting means having:
   a first and a second LED for emitting light;
   a flat circuit board having a conductive track structure, on which circuit board the LEDs are mounted and thereby electrically conductively connected to the conductive track structure;
   a reflector which is assembled with the circuit board and is itself free of LEDs;
   an outer bulb which is transmissive for the light emitted by the LEDs and in which the circuit board with the LEDs and the reflector are arranged, wherein the outer bulb is made of glass and delimits a sealed volume filled with a filling gas, which filling gas has a higher thermal conductivity than air, and wherein the outer bulb is frosted in a scratch-resistant manner on the inside; and
   a base with which the LEDs are electrically operably connected via the conductive track structure;
   wherein the first and the second LED are mounted on mutually opposite sides of the circuit board and, for each LED, at least 20% of the emitted light is incident on the reflector and is reflected thereby in order to homogenize the light distribution generated by the lighting means, for which the particular reflected light has a main propagation direction with a directional component that is parallel to a surface direction of the flat circuit board.

2. The lighting means according to claim 1, wherein the reflector is in one piece.

3. The lighting means according to claim 2, wherein the reflector and the circuit board are fitted each as flat parts into one another at a right angle to one another.

4. The lighting means according to claim 2, wherein the reflector is inserted into a slot in the circuit board and a projection is formed on one of the slot flanks delimiting the slot in relation to the surface directions, said projection engaging in a hole in the reflector and holding the reflector in position.

5. The lighting means according to claim 1, wherein, in the case of the particular reflected light, the particular directional component lying parallel to the particular surface direction is in each case greater than a directional component perpendicular thereto.

6. The lighting means according to claim 1, wherein the light reflected by the reflector is reflected diffusely by the reflector.

7. The lighting means according to claim 1, wherein, for each LED, the circuit board and a side surface of the reflector, on which the light emitted by the LED is incident, adjoin one another at an edge, wherein the LED has a smallest distance taken from the edge along one of the surface directions of the circuit board of not more than 8 mm.

8. The lighting means according to claim 1, wherein, for each LED, the circuit board and a side surface of the reflector, on which the light emitted by the particular LED is incident, adjoin one another at an edge, from which edge, taken perpendicularly up to a margin, the side surface of the reflector has a mean extent d, wherein the LED has a smallest distance to the edge taken along one of the surface directions of not more than $0.3 \cdot d$.

9. The lighting means according to claim 1, wherein the outer bulb has a longitudinal axis and the LEDs are arranged relative thereto such that a particular LED main propagation direction, with which the particular LED emits the light, encloses an angle of at least 80° and not more than 100° with a longitudinal direction parallel to the outer bulb longitudinal axis and pointing away from the base in the direction towards the outer bulb.

10. The lighting means according to claim 1, additionally having a third and a fourth LED, wherein the first and the third LED are arranged together and the second and the fourth LED are arranged together on the same side of the circuit board, wherein the light from the LEDs arranged on the same side is incident on mutually opposite sides of the reflector.

11. The lighting means according to claim 9, wherein a part region of the reflector, which has a surface area of not more than 20% of the reflector as a whole, is partially separated from the remainder of the reflector and folded out in such a manner that light reflected at the reflector part region has a main propagation direction with a dominant directional component parallel to the outer bulb longitudinal axis.

12. The lighting means according to claim 9, wherein there is provided an additional transverse reflector assembled with the circuit board and the reflector, which transverse reflector extends transversely to the outer bulb longitudinal axis.

13. The lighting means according to claim 1, wherein the LEDs each emit the light with a light distribution whose full width at half maximum is >120°.

14. The lighting means according to claim 9, wherein the light distribution generated with the lighting means is homogenized in that light intensity values taken on a circular path around the outer bulb longitudinal axis at an angle of 90° to the outer bulb longitudinal direction in each case represent at least 30% of a maximum value of the light intensity taken on the circular path.

15. The lighting means according to claim 1, wherein the circuit board is formed of a substrate whose mutually opposite sides are each provided with structured copper as the conductive track structure, wherein the copper conductive tracks have a thickness, taken perpendicularly to the surface directions of the circuit board, of at least 35 µm.

16. The lighting means according to claim 1, wherein the circuit board is arranged wholly inside the filling gas volume, wherein preferably at most a portion of a driver electronics is arranged on the circuit board.

17. The lighting means according to claim 1, wherein the circuit board has a width, taken in one of the surface directions, of not more than 30 mm.

18. The lighting means according to claim 1, wherein the reflector has a lower bending stiffness than the circuit board.

19. The lighting means according to claim 1, wherein the circuit board is assembled with a carrier, which carrier carries the circuit board in the outer bulb.

20. A method for producing a lighting means according to claim 1, the method comprising:
providing the circuit board and the reflector each as separate parts; and
assembling the reflector and the circuit board.

21. A method for producing a lighting means according to claim 18, the method comprising:
providing the circuit board and the reflector each as separate parts; and
assembling the reflector and the circuit board, wherein a glass bulb which is open on one side and tapers towards the opening is provided, into which glass bulb the circuit board and the reflector assembled therewith are introduced through the opening, wherein the reflector, at least in part, has a width, taken perpendicularly to the introduction direction, which is greater than a width of the opening taken in the same direction, and the reflector is therefore temporarily resiliently deformed as it is introduced and assumes its original shape again after passing through the opening.

* * * * *